United States Patent
Hung et al.

(10) Patent No.: US 10,026,726 B2
(45) Date of Patent: Jul. 17, 2018

(54) DUMMY GATE TECHNOLOGY TO AVOID SHORTING CIRCUIT

(71) Applicant: UNITED MICROELECTRONICS CORP., Hsin-Chu (TW)

(72) Inventors: Ching-Wen Hung, Tainan (TW); Chih-Sen Huang, Tainan (TW); Shih-Fang Tzou, Tainan (TW); Yi-Wei Chen, Taichung (TW); Yung-Feng Cheng, Kaohsiung (TW); Li-Ping Huang, Miaoli County (TW); Chun-Hsien Huang, Tainan (TW); Chia-Wei Huang, Kaohsiung (TW); Yu-Tse Kuo, Tainan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 15/604,685

(22) Filed: May 25, 2017

(65) Prior Publication Data
US 2017/0263597 A1 Sep. 14, 2017

Related U.S. Application Data

(62) Division of application No. 14/742,589, filed on Jun. 17, 2015, now Pat. No. 9,698,047.

(51) Int. Cl.
*H01L 21/8238* (2006.01)
*H01L 21/768* (2006.01)
(Continued)

(52) U.S. Cl.
CPC .... *H01L 27/0207* (2013.01); *H01L 21/76816* (2013.01); *H01L 21/76829* (2013.01);
(Continued)

(58) Field of Classification Search
CPC ............ H01L 27/0207; H01L 27/0924; H01L 27/092–27/0928; H01L 27/1104;
(Continued)

(56) References Cited

U.S. PATENT DOCUMENTS 8,693,235 B2 4/2014 Liaw
8,946,826 B2 2/2015 Tamaru
(Continued)

*Primary Examiner* — Natalia Gondarenko
(74) *Attorney, Agent, or Firm* — Winston Hsu

(57) ABSTRACT

Semiconductor devices and method of manufacturing such semiconductor devices are provided for improved FinFET memory cells to avoid electric short often happened between metal contacts of a bit cell, where the meal contacts are positioned next to a dummy gate of a neighboring dummy edge cell. In one embodiment, during the patterning of a gate layer on a substrate surface, an improved gate slot pattern is used to extend the lengths of one or more gate slots adjacent bit lines so as to pattern and sectionalize a dummy gate line disposed next to metal contacts of an active memory cell. In another embodiment, during the patterning of gate lines, the distances between one or more dummy gates lines disposed adjacent an active memory cell are adjusted such that their locations within dummy edge cells are shifted in position to be away from metal contacts of the active memory cell.

5 Claims, 13 Drawing Sheets

(51) Int. Cl.
*H01L 27/11* (2006.01)
*H01L 29/78* (2006.01)
*H01L 29/66* (2006.01)
*H01L 27/092* (2006.01)
*H01L 27/02* (2006.01)

(52) U.S. Cl.
CPC ........ *H01L 21/823821* (2013.01); *H01L 21/823871* (2013.01); *H01L 27/0924* (2013.01); *H01L 27/1104* (2013.01); *H01L 29/66545* (2013.01)

(58) Field of Classification Search
CPC ....... H01L 21/28506; H01L 21/823871; H01L 21/823821; H01L 21/76829; H01L 21/76816; H01L 29/66545; H01L 29/7855–29/7856; H01L 2029/7858; H01L 2224/116; H01L 2224/276; H01L 2224/27912; H01L 27/0218; H01L 27/1052; H01L 21/8229; H01L 21/823437; H01L 21/823456; H01L 21/823475; H01L 21/8232; H01L 21/823828; H01L 21/8239; H01L 21/82385; H01L 21/845; H01L 29/66484; H01L 29/772; H01L 29/7831; H01L 29/7834; H01L 2924/1433; H01L 2924/1435; H01L 2924/1436; H01L 2924/14361; H01L 2924/1437; H01L 2027/11866; H01L 2027/1187; H01L 2027/11872; H01L 2027/11874; H01L 27/108; H01L 27/10826; H01L 27/11; H01L 27/1116; H01L 27/1211
USPC ............... 257/347, 390, 401, 402, 750, 758, 257/E27.098, E21.661, E21.409; 438/128, 129, 153, 158, 629, 631, 438/666–669, 671, 672, 675, 591, 759
See application file for complete search history.

(56) References Cited

U.S. PATENT DOCUMENTS

| | | | |
|---|---|---|---|
| 2005/0044522 A1* | 2/2005 | Maeda | G06F 17/5068 716/53 |
| 2007/0002617 A1 | 1/2007 | Houston | |
| 2007/0164317 A1 | 7/2007 | Nakanishi | |
| 2009/0014796 A1 | 1/2009 | Liaw | |
| 2012/0244694 A1* | 9/2012 | Shinohara | H01L 27/105 438/591 |
| 2013/0130511 A1* | 5/2013 | Smayling | H01L 21/027 438/759 |
| 2015/0084129 A1 | 3/2015 | Lee | |

* cited by examiner

DUMMY GATE TECHNOLOGY TO AVOID SHORTING CIRCUIT

CROSS REFERENCE TO RELATED APPLICATIONS

This application is a divisional application of U.S. patent application Ser. No. 14/742,589 filed Jun. 17, 2015, which is herein incorporated by reference in its entirety.

BACKGROUND OF THE INVENTION

1. Field of the Invention

Embodiments of the invention relate to static random access memory (SRAM) to be used for storage on integrated circuit devices, and more particularly to advanced SRAM cells using one or more fin field-effect transistor (FinFET) structures. The present invention also relates to the design layout and manufacturing process for fabricating SRAM cells with such fin field-effect transistor structures.

2. Description of the Prior Art

Modern digital data processors generally use several different types of memory devices to answer different performance and functional requirements. Dynamic memories generally store data as charge in a capacitor to allow much faster access, and can be selectively addressed for storing smaller amounts of data each time. However, dynamic memories must be periodically refreshed to compensate for charge that may leak from its capacitors, leading to undesirable longer access time.

Static memory devices, such as static random access memories (SRAMs) with many rows and columns (e.g., arrays) of SRAM storage cells are widely used on integrated circuit devices. Each storage cell includes a bistable circuit, which does not require refreshing. Each bistable circuit comprises at least two transistors and additional selection/pass transistors, and can be switched from one bistable state to another bistable state at a faster speed. The switching speed of each bistable circuit is determined by the resistance and capacitance of the control electrodes of the transistors and the connection of the transistors within the circuit, thereby determining the slew rate of its output voltage. In addition to the desirability of forming larger numbers of SRAM memory cells and arrays on a chip of reasonable size, there is substantial incentive toward size reduction and integrated density increase in each cell. As a result, the resistance and capacitance of transistors and their connections in the SRAM cells can be minimized to improve device performance.

Because conventional SRAMs tend to occupy 50% or more chip area and limit the amount of other logic devices on the chip, recent advances in FinFET transistor technology have made advanced SRAM cells with improved FinFET transistor structures to minimize footprint/bit-cell area, thereby occupying much smaller chip area. In contrast to the prior planar MOS transistors with channels formed at a semiconductor substrate surface, FinFET transistors have three-dimensional (3D) channel region.

FIG. 1 is a schematic view of one example of a FinFET transistor structure 10, which comprises a substrate 18, a source 11, a drain 12, a gate insulator layer 13 and a gate conductor layer 14. In the FinFET transistor structure 10, the channel for the transistor is formed on the sides and the top of a raised "fin"-like structure (e.g., a fin 16), which comprises at least one or more semiconductor materials. The gate conductor layer 14, typically a metal gate, extends over the fin 16 and a gate insulator layer 13, is disposed between the gate conductor layer 14 and the fin 16. At least three surfaces are utilized to provide more current paths in a channel region (not shown) being covered by the gate insulator layer 13 and the gate conductor layer 14 and between the source 11 and the drain 12. Thus, the FinFET transistor structure 10 has better current driving capability than conventional planar FET transistors. As compared to planar transistors, the three-dimensional (3D) shape of the channel region of FinFET transistors in a SRAM cell allows for an increased gate width and a reduced gate length without increased silicon area, provides a reasonable channel width characteristic at a low silicon area cost, and enables the reduction of the overall scale of the SRAM devices. With the use of currently known masking techniques that provide good manufacturing yield, aggressive semiconductor process scaling can be obtained for a minimum feature size of 15 nm and smaller.

In general, a design layout of a SRAM array includes "bit cells" disposed between a pair of imaginary bit lines (BL) with bit line metal contacts arranged thereon in columns. In a design layout, imaginary rows of word lines are also used to separate bit cells. In addition, "bit cells" are formed into arrays in dense area and surrounded by "dummy edge cells" in isolation area or current connection area. The dummy edge cells are generally used to generate a timing signal, to perform a reinforcing function, to replace failed cells and/or to help improve process uniformity, such as etching uniformity concerns during device fabrication. Each bit cell can have, for example, a total of 6 FinFET transistors (6T) connected to single port, or eight FinFET transistors (8T) connected to dual port.

SRAM memory cells and arrays are fabricated by forming metal contacts such as word line contacts, bit line contacts, $V_{SS}$ contacts and $V_{CC}$ contacts, etc., over FinFET transistors to electrically connect these SRAM memory cells and arrays together and ensure normal read and write operations. Word line contacts are electrically connected by higher interconnect layer(s) such as first metal (M1) layer; bit line contacts are electrically connected by higher interconnect layer(s) such as M1, first via (V1) layer and second metal layer (M2).

In applying prior design layout rules, however, problems arose during the fabrication of high-density small-sized SRAM FinFET cell arrays. It was found that, when a current is applied, most of the fabricated metal contacts connected to the source and drain regions of the FinFET transistors near the boundary of a dummy edge cell have resulted in undesirable electrical short to their neighboring dummy gates at or near the edge of the dummy edge cells.

The reason for such electrical short is that, due to pattern density effect, after patterning, the sizes of those metal contact holes at or near a dummy edge cell are larger than the sizes of other metal contact holes within the dense area of a bit cell. What's more adverse is that optical proximity correction (OPC) will even enlarge the sizes of these metal contact holes because they are near isolation area. As a result, the dummy gate of a dummy edge cell becomes too close to the metal contacts and the electrical current goes short through the dummy gate. Such kind of undesirable electrical short is extremely damaging to the formed circuit devices.

During regular SRAM operations, a regular electrical path is going from a high $V_{CC}$ supply voltage (e.g., applying from PMOS to a metal contact) to a ground or $V_{SS}$ voltage (e.g., via NMOS to another metal contact nearby). When the undesirable electrical short happens, the electrical path will now go through the dummy gate of a dummy edge cell closest to the bit line metal contacts, instead of going through the regular electrical path, and the memory devices will fail to perform.

Therefore, there is still a need for an improved design layout of small size FinFET memory device and a method of preparing such an improved device layout and fabricating such improved devices to avoid undesirable electrical short between a high $V_{DD}$ supply voltage of a metal contact to a low $V_{SS}$ voltage of another metal contact nearby through the dummy gate.

SUMMARY OF THE INVENTION

Embodiments of the invention include a method for preparing and generating an improved SRAM FinFET memory device layout and fabricating such improved devices to avoid undesirable electrical short through a dummy gate (e.g., the dummy gate of a dummy edge cell neighboring a bit cell), an electric current is going through a dummy gate from a high $V_{CC}$ supply voltage of a nearby metal contact of a neighboring bit cell to a low $V_{SS}$ voltage of another metal contact of the neighboring bit cell. Such electric short can happen through a dummy gate which is positioned near the edge of any edge cell positioned next to a neighboring bit cell, and the electric current can short between one metal contact (e.g., bit line metal contact, $V_{SS}$ contact, $V_{CC}$ contact, etc.) of the neighboring bit cell and another metal contact (e.g., bit line metal contact, $V_{SS}$ contact, $V_{CC}$ contact, etc.) of the neighboring bit cell, when these metal contacts are positioned near the dummy gate of the edge cell. It was found that in the neighboring bit cell, various metal contacts, including bit line metal contacts, $V_{SS}$ contacts, $V_{CC}$ contacts, etc., which are positioned next to a dummy gate line of the edge cell have the risk of shorting through the dummy gate line of the edge cell, In one embodiment, a semiconductor memory device is provided and includes an active cell comprising a first metal contact and a second metal contact, a dummy edge cell disposed adjacent the active cell, a first dummy gate line formed within the dummy edge cell, and a second dummy gate line formed next to the first dummy gate line within the dummy edge cell, where the first metal contact and the second metal contact are disposed adjacent the first dummy gate line. In addition, the first dummy gate line is sectionalized at at least one location positioned between the first metal contact and the second metal contact. The semiconductor device may be a SRAM FinFET memory device where the active cell includes one or more FinFET structures formed therein. The first metal contact and the second metal contact may be selected from the group consisting of word line contacts, bit line contacts, $V_{SS}$ contacts, and $V_{CC}$ contacts.

In one aspect, the first dummy gate line is sectionalized by a gate-end spacing at at least one location positioned between the two metal contacts. In another aspect, the first dummy gate line is sectionalized at at least one location positioned between two metal contacts by a plurality of gate slots during gate slot patterning, where a gate slot pattern is used during the gate slot patterning and the gate slot pattern includes one or more first gate slots at a first length within the dummy edge cell and one or more second gate slots at a second length within the active cell. In one example, the first length is larger than the second length. In another example, the first length is more than one and a half times in length than the second length.

In another embodiment, a semiconductor device includes an active cell and a dummy edge cell disposed adjacent the active cell, where the active cell includes a first metal contact and a second metal contact, a first gate line disposed within the active cell and adjacent the first metal contact and the second metal contact, and a second gate line disposed at a first distance ($D_1$) from the first gate line within the active cell. In addition, the dummy edge cell includes a first dummy gate line disposed within the dummy edge cell and adjacent the first metal contact and the second metal contact of the active cell, and a second dummy gate line disposed at a second distance ($D_2$) from the first dummy gate line within the dummy edge cell, where a third distance ($D_3$) is between the first gate line and the first dummy gate line. In one example, the third distance ($D_3$) is larger the first distance ($D_1$). In another example, the third distance ($D_3$) is larger the second distance ($D_2$). In yet another example, the patterning the gate layer according to the gate slot pattern can be performed prior to or after the patterning the gate layer according to the gate line pattern.

Another embodiment of the invention provides a method for processing a semiconductor memory device and the method includes depositing a gate layer over a substrate, patterning the gate layer according to a gate slot pattern and a gate line pattern to form a first gate line and a second gate line within an active cell, and a first dummy gate line and a second dummy gate line within a dummy edge cell, and forming a first metal contact and a second metal contact in the active cell, where the first metal contact and the second metal contact are disposed adjacent the first dummy gate line, and wherein the gate layer is patterned according to the gate slot pattern and the gate line pattern so as to sectionalize the first dummy gate line at at least one location between the first metal contact and the second metal contact during the patterning of the gate layer.

Additional embodiment of the invention provides a method for fabricating a semiconductor memory device and the method includes depositing a gate layer over a substrate, patterning the gate layer according to a gate line pattern line and a gate slot pattern to form a first gate line within an active cell and a first dummy gate line and a second dummy gate line within a dummy edge cell, and forming a first metal contact and a second metal contact in the active cell. In one aspect, the first gate line is adjacent the first metal contact and the second metal contact and disposed at a first distance ($D_1$) from the second gate line within the active cell. In another aspect, the first dummy gate line is adjacent the first metal contact and the second metal contact and disposed at a second distance ($D_2$) from a second dummy gate line. In still another aspect, the first gate line is disposed at a third distance ($D_3$) from the first dummy gate line, and the third distance ($D_3$) is different from the first distance ($D_1$).

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of this invention provide a novel static random access memory (SRAM) comprising fin field-effect transistor (FinFET) structures to prevent electrical short to the dummy gate of an edge cell between a high $V_{CC}$ supply voltage of a metal contact disposed in an bit cell to a low $V_{SS}$ voltage of a nearby metal contact disposed in the same bit cell. In addition, the corresponding design layouts and a process of fabricating such improved SRAM (FinFETs) devices according to the improved device design layout for the corresponding edge cells and bit cells are presented.

Figure 2:
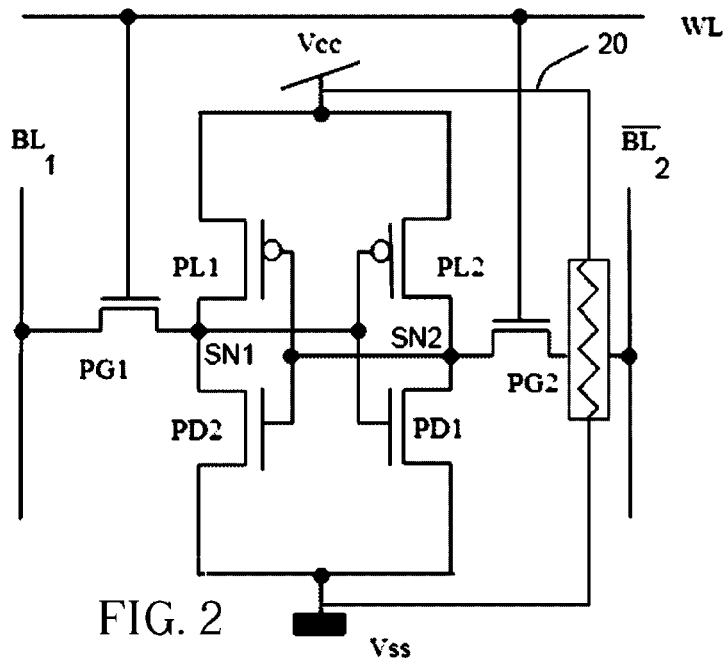
FIG. 2 illustrates an electric circuit diagram of a static random access memory (SRAM) cell with 6 FinFET transistors.

FIG. 2 is a circuit diagram of a static random access memory (SRAM) cell with 6 FinFET transistors (6T). The SRAM cell includes pass-gate transistors PG1 and PG2, pull-up transistors PL1 and PL2, and pull-down transistors PD1 and PD2. The gates of pass-gate transistors PG1 and PG2 are controlled by word-line (WL) that determines whether the current SRAM cell is selected or not. The storage portion of the SRAM cell circuit is formed of four transistors, pull-up transistors PL1 and PL2 and pull-down transistors PD1 and PD2, in true and complementary form, which make a cross-coupled latch-like pair of CMOS inverters, stores a "bit" on storage nodes labeled SN1 and SN2. Pull up transistor PL-1 and pull down transistor PD-1 form one inverter with an output at the storage node SN1. Pull up transistor PL-2 and pull down transistor PD-2 form another inverter with the output at another storage node SN2. The SRAM cell is powered through a positive power supply node, $V_{CC}$, and another power supply node, $V_{SS}$, which may be an electrical ground.

The pull up transistors PL-1 and PL-2 may be p-type transistors. When the gate terminal of these p-type transistors is below a threshold voltage, these transistors will turn on and couple the positive voltage supply labeled "$V_{DD}$" to the respective storage nodes, SN1, SN2, thereby "pulling up" on the nodes SN1, SN2 at the output. The pull down transistors PD1 and PD2 are typically n-type transistors and when the gate voltage exceeds a predetermined threshold voltage, the pull down transistors turn on and couple the respective storage node to the ground or $V_{SS}$ voltage.

Each inverter of the pair of cross-coupled inverters drives the input of the other and maintains the voltages at the storage nodes. In operation, when the pass gate transistors, PG1 and PG2, are inactive, the SRAM cell maintains the complementary values at the nodes SN1, SN2 and remains stable until the power is removed from the SRAM, or, a write cycle is performed to change the stored data.

During a write cycle, the word line (WL) becomes active (e.g., at logic "one" or "high" voltage state) and turns on the pass gates, PG1 and PG2. When the pass gates PG1 and PG2 are on, the storage nodes SN1, SN2 are able to couple to the respective bit lines, BL1 and BL2. If the storage node (SN1) is at logic "one" or high voltage state, and the voltage of the bit line BL1 is a "zero", or low voltage, then the pass gate transistor PG-1 and the bit line BL1 would discharge the storage node SN1, in opposition to the action of the pull up transistor PL-1. At the same time, the storage node (SN2) is at its logic "zero" or "low" voltage state and the complementary data on the bit line BL2 is at logic "one" or high voltage state. As such, the pull down transistor PD-2 is trying to pull down on the bit line BL2. Overall, as the value of the storage node SN2 rises, the pull up transistor PL-1 will cut off, and, as the value of the storage node SN2 falls (due to the discharge through the pass gate PG-1), the pull down transistor PD-2 will cut off. In general, during write cycles, the pull up transistors PL-1 and PL-2 may be coupled so as to oppose the pass gate transistors PG-1 and PG-2 when the stored data switches.

During a read cycle, the bit lines BL1 and BL2 are initially not actively driven. One of the bit lines, BL1 or BL2 may be placed at an intermediate voltage or a high voltage in a "pre-charge" operation. The word line (WL) then goes active and couples the bit lines BL1 and BL2 to the respective storage nodes SN1 and SN2. One of the two storage nodes SN1 and SN2 is at a logic "zero" or low voltage state, which means one of the pull down transistors PD-1 or PD-2 is coupled to a bit line through the pass gates PG-1 or PG-2, and that one of the pull down transistors PD-1 or PD-2 would need to discharge that bit line in order to pull it down. So the drive strength of the pull down transistors PD-1 or PD-2 affects read access time.

Figure 3:
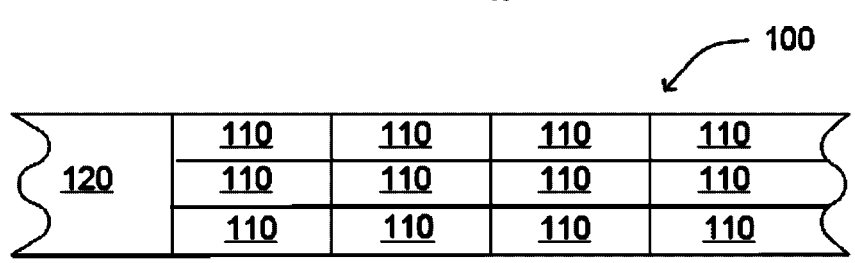
FIG. 3 illustrates an exemplary portion of a SRAM array 100 with one or more bit cells and dummy edge cells.

FIG. 3 illustrates an exemplary layout of a portion of a SRAM array 100 with one or more bit cells 110 and edge cells (e.g., dummy edge cells 120, among others). The SRAM array 100 may include a plurality of the bit cells 110 arranged in rows and columns, and a plurality of the dummy edge cells 120 disposed in-line near the outer edge column of the bit cells 110 in the edge area of the SRAM array 100. Each bit cell 110 may include 6 FinFET transistors (6T) as shown in FIG. 2, or alternatively, 8 FinFET transistors (8T).

Figure 4A:
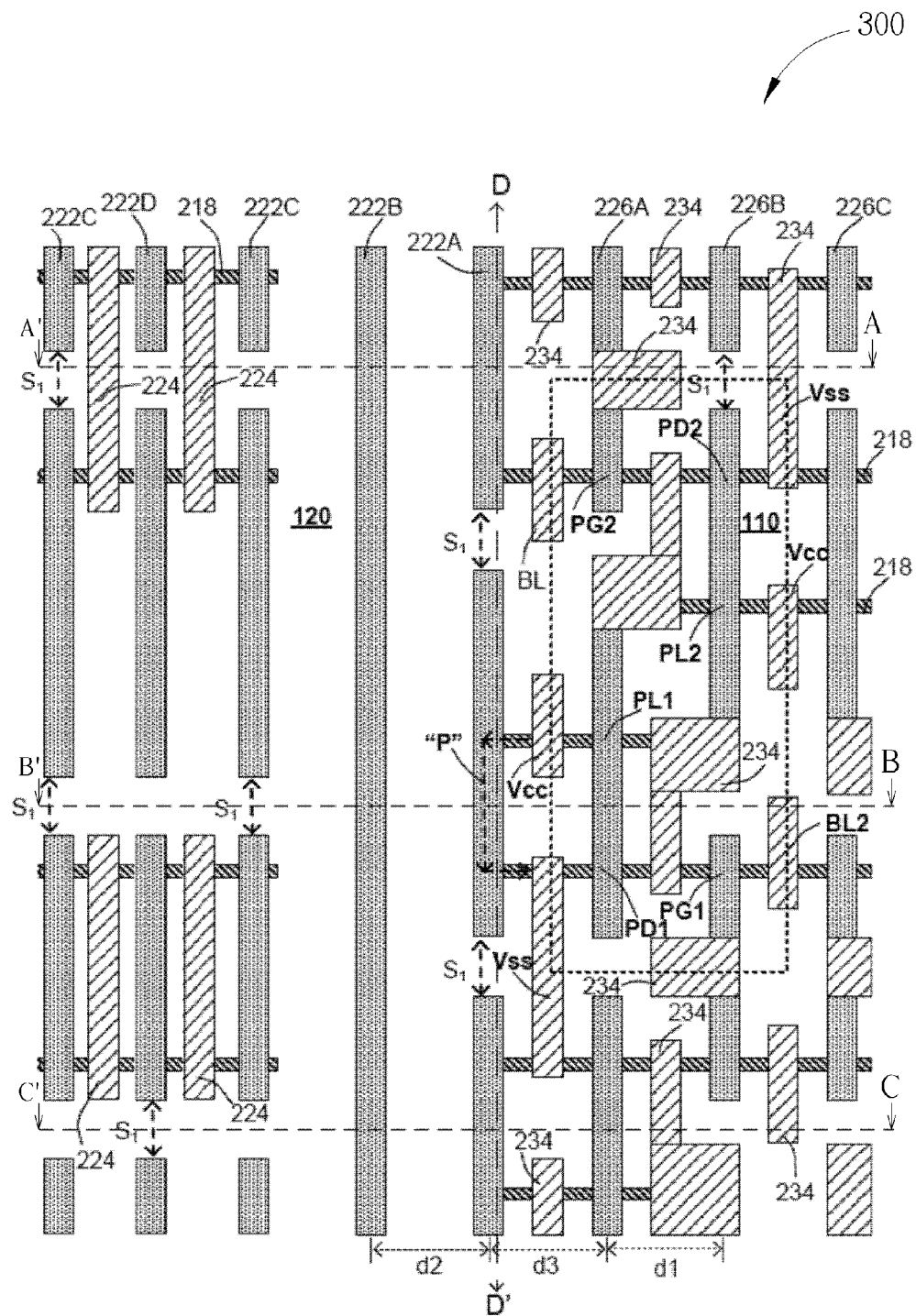
FIG. 4A illustrates a portion of an exemplary device design layout of a SRAM array 300 with a plurality of dummy gate lines within an exemplary dummy edge cell and a plurality of gate lines within an exemplary active cell.

FIG. 4A illustrates an exemplary device design layout of a portion of a SRAM array 300 near the boundary of a bit cell 110 and a dummy edge cell 120. The portion of the SRAM array 300 may include a plurality of gate lines and a plurality of metal contacts 234 within the bit cell 110, a plurality of dummy gate lines and a plurality of metal contacts 224 within the dummy edge cell 120, all of which are disposed in three-dimension and spatially arranged above a plurality of fin structures 218.

The dummy gate lines within the dummy edge cell 120 may include the first dummy gate line 222A, the second dummy gate line 222B, the third dummy gate line 222C, a fourth dummy gate line 222D, etc. The gate lines within the bit cell 110 may include the first gate line 226A, the second gate line 226B, the third gate line 226C, etc. These gate lines and dummy gate lines are formed equally-spaced apart during device fabrication using gate layer deposition and gate line patterning techniques.

It was found that electric shorts often happen between some and/or all metal contacts 234 which are disposed in the boundary between of the bit cell 110 and the dummy edge cell 120. As the integrated circuits are increasingly developed toward miniaturization, metal contacts, such as bit line (BL) metal contacts, $V_{CC}$ metal contacts, the $V_{SS}$ metal contacts, etc., which are disposed at the edge of active memory cells, are all at risk of electric short ("P" in FIG. 4A), where electric current may undesirably go from the $V_{CC}$ metal contacts 234 (which is electrically connected to a positive power supply node at a voltage, $V_{CC}$) via a path "P" through the first dummy gate line 222A to the $V_{SS}$ metal contact 234 (which is electrically connected to another power supply node, $V_{SS}$).

Referring back to FIG. 2, an electric short is shown at the circuit diagram as an electric path 20, where an electric short happens from $V_{CC}$ to $V_{SS}$. As shown in FIG. 2, when two metal contacts near the boundary of an active cell are designed and fabricated too close to the dummy gates of an dummy edge cell, the electrical path 20 is undesirably generated, causing an electrical short between two metal contacts 234 via dummy gates near the boundary of the dummy edge cell and the active cell. It is a common and crucial issue for SRAM memory cells formed using FinFET transistor structures at feature size of about 14 nm or smaller.

Figures 4B, 4C, 4D:
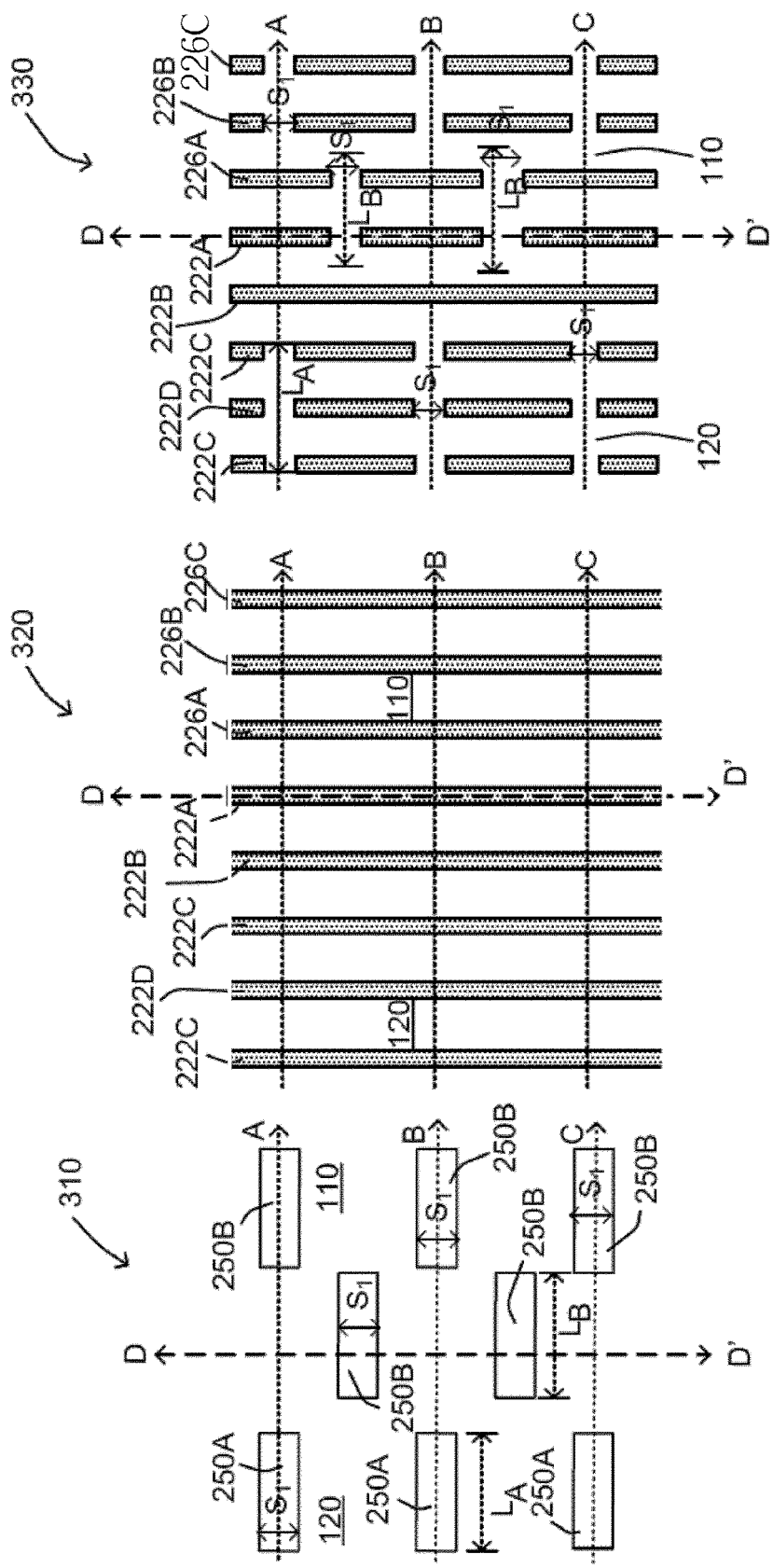
FIG. 4B illustrates a portion of an example of a gate slot pattern 310 which can be used during patterning of a gate layer according to the exemplary device design layout of the SRAM array 300 as shown in FIG. 4A and the gate slot pattern 310 includes a plurality of dummy gate slots positioned within the dummy edge cell and a plurality of gate slots positioned within the active cell.
FIG. 4C illustrates a portion of an example of a gate line pattern 320 which can be used during patterning of a gate layer according to the exemplary device design layout of the SRAM array 300 as shown in FIG. 4A and the gate line pattern 320 includes a plurality of dummy gate lines positioned within the dummy edge cell and a plurality of gate lines positioned within the active cell.
FIG. 4D illustrates a portion of a top view of a gate layer after gate line patterning and gate slot patterning according to the exemplary device design layout of the SRAM array 300 as shown in FIG. 4A and shows a plurality of sectionalized and unsectionalized dummy gate lines positioned within the dummy edge cell and a plurality of sectionalized gate lines positioned within the active cell.

FIG. 4B illustrates a portion of an example of a gate slot pattern 310 which can be used during patterning of a gate layer according to the exemplary device design layout of the SRAM array 300 as shown in FIG. 4A. The gate slot pattern 310 includes a plurality of dummy gate slots 250A positioned within or near the dummy edge cell 120 and a plurality of gate slots 250B within or between the bit cells 110 or between the bit cells and the dummy edge cell 120. In general, designing a layout for the dummy gate slots 250A and gate slots 250B, as shown as a gate slot pattern during gate slot patterning, is useful during fabrication of the SRAM array where gate line patterning techniques are used to form the first, second, third gate lines 226A, 226B, 226C, and the first, second, third dummy gate lines 222A, 222B, 222C, 222D, etc., and gate slot patterning techniques are used to sectionalize and cut a portion of the first, second, third gate lines 226A, 226B, 226C and the first, second, third dummy gate lines 222A, 222B, 222C, 222D, etc., prior to or after they are formed.

As shown in the gate slot pattern 310 of FIG. 4B, each dummy gate slot 250A has a length, "$L_A$", and each gate slot 250B has a length "$L_B$". In addition, for ease of fabrication, the width of each dummy gate slot 250A and the width of each gate slot 250B may be the same width of "$S_1$".

Accordingly, a pattern of a plurality of dummy gate slots 250A can be positioned within the dummy edge cell 120 for patterning the gate layer during fabrication and sectioning of the dummy gate lines inside the dummy edge cell 120. Thus, the dummy gates within the dummy edge cell 120 are spaced apart at a distance equaling to the width of the gate slot, "$S_1$", i.e., a gate-end spacing.

Similarly, a pattern of a plurality of gate slots 250B are positioned within the bit cell 110 and between the bit cell 110 and the dummy edge cell 120 for patterning (e.g., lithography and etching, etc.) the gate layer during fabrication and sectioning of the gate lines inside the bit cells 110 and between the bit cell 110 and the dummy edge cell 120. Thus, the gates within the active cell 110 are spaced at a distance "$S_1$", a gate-end spacing.

The location and size of the dummy gate slots 250A and gate slot 250B for use during gate slot patterning are not shown in the SRAM array 300. In FIG. 4A; however, the pattern of the resulting sectionalized dummy gate lines and sectionalized gate lines are shown.

FIG. 4C illustrates a portion of a gate line pattern 320 which can be used during patterning of a gate layer according to the exemplary device design layout of the SRAM array 300 of FIG. 4A. The gate line pattern 320 can be used during patterning (e.g., lithography and etching, etc.) of the gate layer and forming gate lines within the bit cells 110 and the dummy edge cell 120. In FIG. 4C, one or more first dummy gate line 222A, second dummy gate line 222B, third dummy gate line 222C, fourth dummy gate line 222D, first gate line 226A, second gate line 226B, third gate line 226C, etc., can be formed in parallel lines which are equally-spaced apart during device fabrication using gate layer deposition and gate line patterning techniques.

FIG. 4D illustrates a portion of a top view of a gate line pattern 330 formed according to the exemplary device design layout of the SRAM array 300 of FIG. 4A. For example, a gate layer may be formed over a substrate, and gate line patterning and gate slot patterning techniques can be conducted on the gate layer. The gate line patterning and gate slot patterning techniques can be conducted sequentially or vice versa on the gate layer.

As shown in FIG. 4D, the gate line pattern 330 may include a plurality of sectionalized dummy gate lines (e.g., the third dummy gate line 222C and the fourth dummy gate line 222D, etc.), which are sectionalized by the presence of the dummy gate slot 250A (with a length $L_A$) and spaced at a length of the gate-end spacing "$S_1$" (i.e., the width of the gate slot 250A) apart during gate slot patterning. The gate line pattern 330 may also include a plurality of sectionalized gate lines (e.g., the second gate line 226B and the second gate line 226C, etc.), which are sectionalized by the presence of the gate slot 250B (with a length $L_B$) and spaced at a length of the gate-end spacing "$S_1$" (i.e., the width of the gate slot 250B) apart during gate slot patterning.

In addition, the first dummy gate line 222A and the first gate line 226A, which are disposed closest to the boundary of the dummy edge cell 120 and the bit cells 110, are sectionalized by the presence of the gate slot 250B (with a length $L_B$) during gate slot patterning, thereby positioned at a gate-end spacing, $S_1$, apart. Most importantly, in the gate line pattern 330, some of the dummy gate lines (e.g., the second dummy gate line 222C, etc.) are not sectionalized. Further, the dummy gate line 222A and the first gate line 226A may be sectionalized at different positions as compared to the positions where the third dummy gate line 222C and the fourth dummy gate line 222D are sectionalized.

Figure 5A:
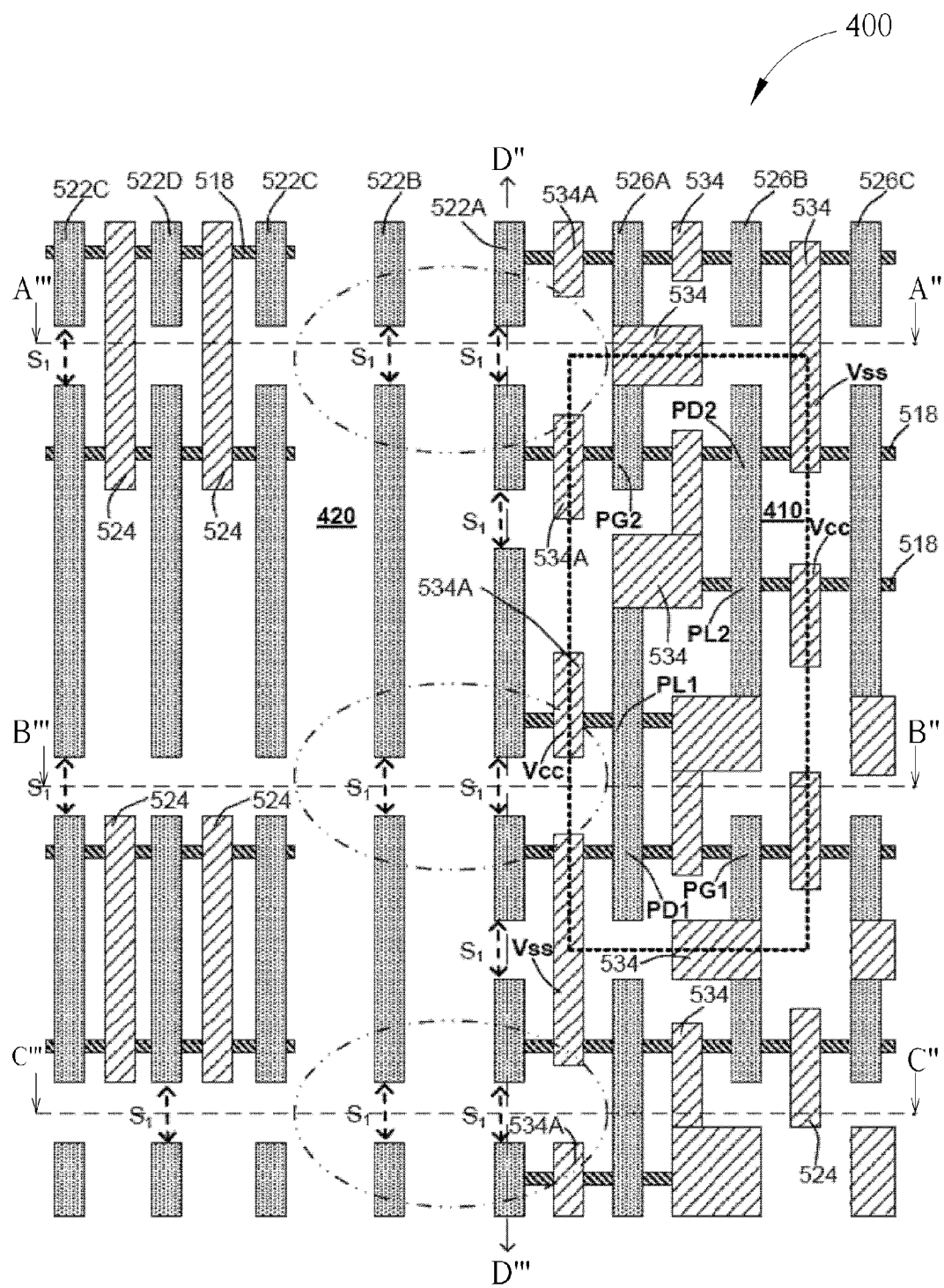
FIG. 5A illustrates a portion of an exemplary device design layout of a SRAM array 400 having a plurality of gate lines within an exemplary active cell and a plurality of dummy gate lines being sectionalized within an exemplary dummy edge cell according to one or more embodiments of the invention.

FIG. 5A illustrates a portion of an exemplary device design layout of a SRAM array 400 according to one or more embodiments of the invention. The design layout of the SRAM array 400 is contemplated to avoid electric shorts happened between metal contacts. The SRAM array 400 near the boundary of a bit cell 410 and a dummy edge cell 420 may include a plurality of dummy gate lines (e.g., a first dummy gate line 522A, a second dummy gate line 522B, a third dummy gate line 522C, a fourth dummy gate line 522D, etc.) within the dummy edge cell 420 and a plurality of gate lines (e.g., a first gate line 526A, a second gate line 526B, a third gate line 526C, etc.) within the active cell 410.

One or more metal contacts 534 and one or more metal contacts 524 are generally disposed within the bit cell 410 and within the dummy edge cell 420 above a plurality of fin structures 518. In addition, the location and size of the dummy gate slots 550A and gate slot 550B for use during gate slot patterning are only shown in FIG. 5B, thus not shown in the design layout of the SRAM array 400; however, the pattern of the resulting sectionalized dummy gate lines and sectionalized gate lines are shown in FIG. 5A.

As shown in FIG. 5A, a number of metal contacts 534A are located between the first dummy gate line 522A of the dummy edge cell 420 and the first gate line 526A of the bit cell 410. According to one embodiment of the invention, to prevent electric short from some and/or all of the metal contacts 534A through the first dummy gate line 522A during the operation of the SRAM array 400, the first dummy gate line 522A is designed to be sectionalized at at least one location in-between two metal contacts 534A.

In one aspect, the first dummy gate line is sectionalized at at least one location positioned between two metal contacts 534A, such as a first metal contact and a second metal contact, wherein the first metal contact and the second metal contact are selected form the group consisting of word line contacts, bit line contacts, $V_{SS}$ contacts, and $V_{CC}$ contacts. In another aspect, the first metal contact and the second metal contact are disposed adjacent the first gate line 526A. In still another aspect, the first metal contact and the second metal contact are disposed adjacent the first dummy gate line 522A. For example, the first metal contact and the second metal contact are positioned between the first gate line 526A and the first dummy gate line 522A.

In another embodiment, in addition to be sectionalized by the gate slot 550B (with a length $L_B$ and a width $S_1$) during gate slot patterning, the first dummy gate line 522A are designed to also be sectionalized by the presence of the gate slot 550A (with a length $L_1$ and a width $S_1$), as will be described in detail below with reference to FIG. 5B. As a result, in the SRAM array 400, the dummy gates (present on the first dummy gate line 522A) are positioned at a gate-end spacing, "$S_1$", apart at at least one position between two metal contacts. Accordingly, some or all of these metal contacts 534A, including those metal contacts connected to various power supply nodes, shown as $V_{CC}$, $V_{SS}$, etc., are not at risk of electric short during operation of the SRAM array 400 because It is contemplated that each of the metal contacts 534A, which are connected to various power supply nodes, shown as $V_{CC}$, $V_{SS}$, etc., and located between the first dummy gate line 522A of the dummy edge cell 420 and the first gate line 526A of the bit cell 410, would not short through the first dummy gate line 522A during the operation of the SRAM array 400, because the first dummy gate line 522A are sectionalized at additional locations (as shown in dotted circles in FIG. 7A) in-between two bit line metal contacts 534A. Another embodiment of the invention provides that all of the dummy gate lines, including the first dummy gate line 522A, the second dummy gate line 522B, the third dummy gate line 522C, the fourth dummy gate line 222D, etc., are sectionalized within dummy edge cells.

Figures 5B, 5C, 5D:
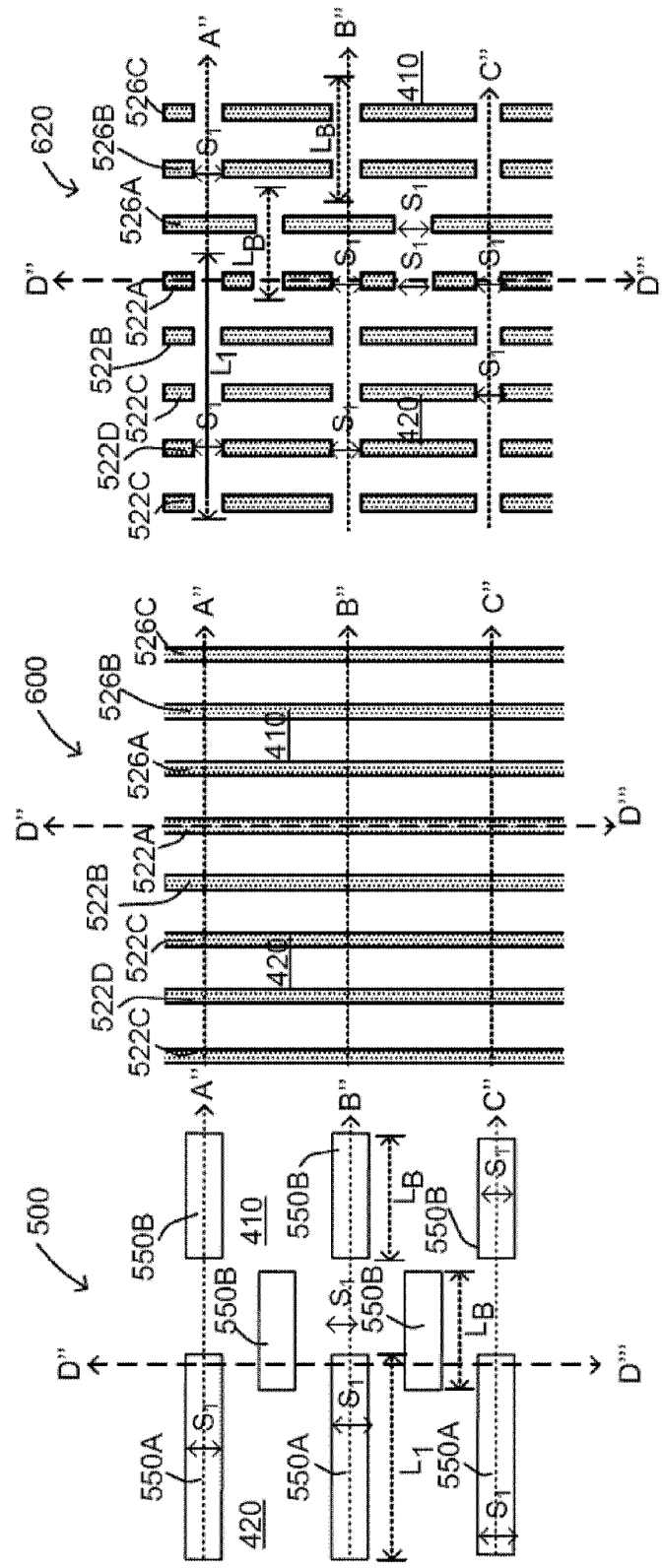
FIG. 5B illustrates a portion of an example of a gate slot pattern 500 which can be used during patterning of a gate layer according to the exemplary device design layout of the SRAM array 400 as shown in FIG. 5A and the gate slot pattern 500 includes a plurality of dummy gate slots positioned within the dummy edge cell and a plurality of gate slots positioned within the active cell, according to one or more embodiments of the invention.
FIG. 5C illustrates a portion of an example of a gate line pattern 600 which can be used during patterning of a gate layer according to the exemplary device design layout of the SRAM array 400 as shown in FIG. 7A and the gate line pattern 600 includes a plurality of dummy gate lines positioned within the dummy edge cell and a plurality of gate lines positioned within the active cell, according to one or more embodiments of the invention.
FIG. 5D illustrates a portion of a top view of a gate layer after gate line patterning and gate slot patterning according to the exemplary device design layout of the SRAM array 400 as shown in FIG. 5A and shows a plurality of sectionalized dummy gate lines positioned within the dummy edge cell and a plurality of sectionalized gate lines positioned within the active cell, according to one or more embodiments of the invention.

FIG. 5B illustrates a portion of a gate slot pattern 500 which can be used during patterning of a gate layer within the SRAM array 400 as shown in FIG. 5A, according to one or more embodiments of the invention. In the gate slot pattern 500, a pattern of a plurality of dummy gate slots 550A (with a first length $L_1$ and a width $S_1$) are positioned within the dummy edge cell 420 for patterning the gate layer during fabrication and sectioning dummy gate lines inside the dummy edge cell 420. In addition, a pattern of a plurality of gate slots 550B (with a second length $L_B$ and a width $S_1$) are positioned within the bit cell 410 and between the bit cell 410 and the dummy edge cell 420 for patterning (e.g., lithography and etching, etc.) the gate layer during fabrication and sectioning gate lines inside the bit cells 410 and between the bit cell 410 and the dummy edge cell 420.

In one embodiment, each dummy gate slot 550A which cut and sectionalize the first dummy gate line 522A during gate slot patterning, has a first length, $L_1$, and each gate slot 550B has a length, $L_B$. In another embodiment, the first length, $L_1$, is larger than the length, $L_B$. It is contemplated to extend the length of the first length, $L_1$, of each dummy gate slot 550A to additionally cut and sectionalize the first dummy gate line 522A (not shown in FIG. 5B) at one or more locations such that no electric short would happen between metal contacts 534A via those locations of the first dummy gate line 522A. In one example, a hardmask is used to process a semiconductor device during gate slot lithography and etching using a gate slot pattern (e.g., the gate slot pattern 500, etc.). In one aspect, the gate slot pattern includes one or more first gate slots (e.g., dummy gate slots 550A, etc.) at the first length, $L_1$, within a dummy edge cell (e.g., dummy edge cell 420, etc.) and one or more second gate slots (e.g., gate slots 550B, etc.) at a length, $L_B$, within an active cell (e.g., the bit cell 410, etc.), where the first length, $L_1$, is more than one and a half times longer than the length, $L_B$.

FIG. 5C illustrates a portion of a gate line pattern 600 which can be used during patterning of a gate layer according to the exemplary device design layout of the SRAM array 400 shown in FIG. 5A. According to one or more embodiments of the invention, the gate line pattern 600 can be used during patterning (e.g., lithography and etching, etc.) of the gate layer and forming gate lines within the bit cell 410 and the dummy edge cell 420. In FIG. 5C, one or more first dummy gate line 522A, second dummy gate line 522B, third dummy gate line 522C, fourth dummy gate line 222D, first gate line 526A, second gate line 526B, third gate line 526C, etc., can be formed in parallel lines which are equally-spaced apart during device fabrication using gate line deposition and gate line patterning techniques.

FIG. 5D illustrates a portion of a top view of a gate line pattern 620 formed after gate line patterning and gate slot patterning according to the exemplary device design layout of the SRAM array 400 of FIG. 5A. The gate line patterning and gate slot patterning techniques used to generate the gate line pattern 620 during the fabrication of a gate layer within the SRAM array 400 can be conducted sequentially or vice versa over a semiconductor substrate. In one aspect, the first dummy gate line 522A is sectionalized at at least one location positioned between two metal contacts 534A after gate slot patterning.

According to one or more embodiments of the invention, the gate line pattern 620 may include a plurality of sectionalized dummy gate lines (e.g., the first dummy gate line 522A, the second dummy gate line 522B, the third dummy gate line 522C, and the fourth dummy gate line 522D, etc.). In one embodiment, all of the dummy gate lines are sectionalized by the presence of the dummy gate slot 550A (with a length $L_1$) during gate slot patterning. In another embodiment, the gate line pattern 620 may also include a plurality of sectionalized gate lines (e.g., the second gate line 526B and the third gate line 526C, etc.), which are sectionalized by the presence of the gate slot 550B (with a length $L_B$) during gate slot patterning.

As shown in FIG. 5D, the first dummy gate line 522A and the first gate line 526A, which are disposed closest to the boundary of the dummy edge cell 420 and the bit cells 410, are sectionalized by the presence of the gate slot 550B (with a length $L_B$) during gate slot patterning. Furthermore, according to one or more embodiments of the invention, the first dummy gate line 522A, which is disposed closest to the boundary of the dummy edge cell 420 and the bit cell 410, is sectionalized by both the presence of the gate slot 550A (with a length $L_1$) and the presence of the gate slot 550B (with a length $L_B$) during gate slot patterning. Contrary to the gate line pattern 330 of FIG. 4D, in the gate line pattern of 620 of FIG. 5D, all of the dummy gate lines are sectionalized to ensure that the first dummy gate line 522A are sectionalized at at least one location in-between two adjacent metal contacts 534A (e.g., the metal contacts 534A that are disposed adjacent the dummy gate line 522A). As a result, the dummy gates on the first dummy gate line 522A are positioned at a gate-end spacing, "$S_1$", apart at at least one position between two metal contacts.

FIGS. 6A-6D illustrate a cross sectional view of a portion of the SRAM array 300 of FIG. 4A, cutting along the line A-A', the line B-B', the line C-C', the line D-D', respectively, to show the structures and the numbers of gates and metal contacts within the active cell, and the dummy gates and dummy metal contacts within the dummy edge cell. FIGS. 7A-7D illustrates a cross sectional view of a portion of the SRAM array 400 of FIG. 5A, cutting along the line A"-A'", the line B"-B'", the line C"-C'", the line D"-D'", respectively, to show the structures and the numbers of gates and metal contacts within the active cell, and the dummy gates and dummy metal contacts within the dummy edge cell, according to one or more embodiments of the invention.

Figure 6A:
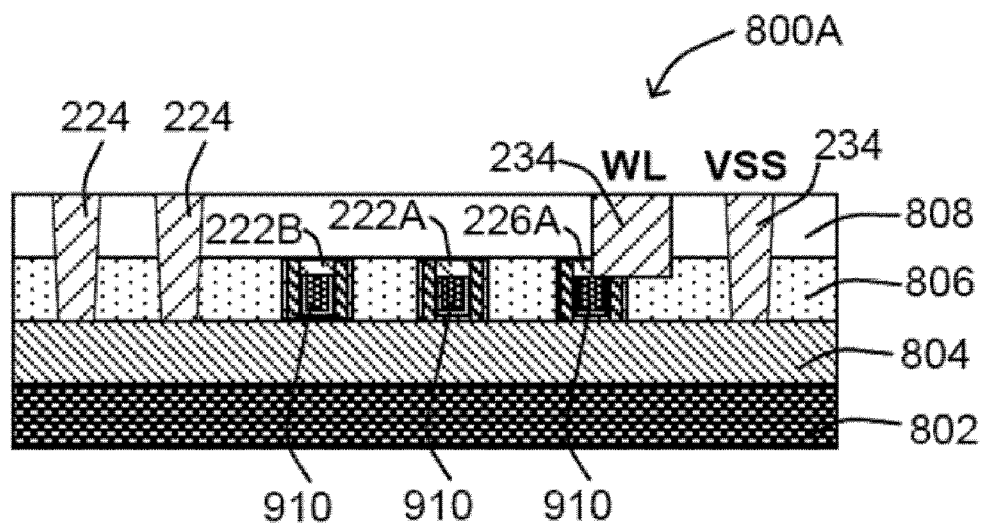
FIG. 6A illustrates a cross sectional view of the SRAM array 300 of FIG. 4A, cutting along a line A-A', showing the structures and the numbers of gates and metal contacts within the active cell, and the dummy gates and dummy metal contacts within the dummy edge cell.
Figure 7A:
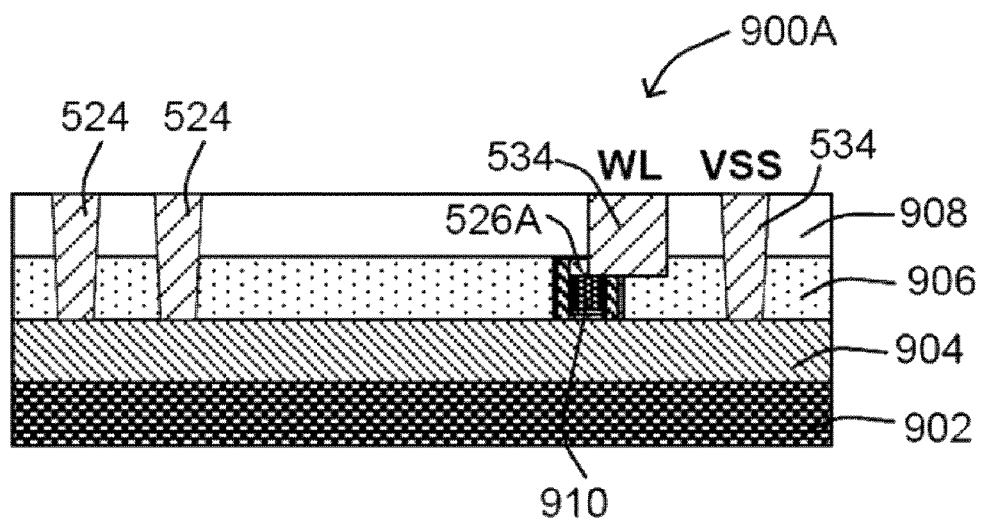
FIG. 7A illustrates a cross sectional view of the SRAM array 400 of FIG. 5A, cutting along a line A'-A''', showing the structures and the numbers of gates and metal contacts within the active cell, and the dummy gates and dummy metal contacts within the dummy edge cell, according to one or more embodiments of the invention.

In FIG. 6A a portion of a SRAM array 800A may include a semiconductor substrate 802, a shallow trench isolation (STI) structure 804, a interlayer dielectric (ILD) layer 806, and a pre-metal dielectric (PMD) layer 808. In FIG. 7A, a portion of a SRAM array 900A may include a semiconductor substrate 902, a shallow trench isolation (STI) structure 904, an interlayer dielectric (ILD) layer 906, and a pre-metal dielectric (PMD) layer 908.

The semiconductor substrates 802, 902 may be, for example, bulk silicon substrates, a silicon-on-insulator (SOI) wafer with a three-layered configuration having a bottom layer (e.g., a thick wafer which provides structural support), an intermediate layer (e.g., a thin silicon dioxide insulator layer or a buried oxide (BOX) layer), and a top layer (e.g., a thin silicon layer, which forms into fin structures after photolithography and etching). In one embodiment, the semiconductor substrates 802, 902 includes fin structures 218, 518, respectively.

The shallow trench isolation (STI) structures 804, 904 may include oxide materials formed into trench features early during semiconductor fabrication process (e.g., prior to forming transistors) to prevent electrical current leakage between adjacent semiconductor device components. The shallow trench isolation (STI) structures 804, 904 may be formed by etching a pattern of trenches in a silicon layer, depositing one or more dielectric materials (e.g., silicon oxide materials) to fill the trenches, and removing excess dielectric materials by a polishing technique (e.g., chemical mechanical planarization, etc.)

The interlayer dielectric (ILD) layer 806, 906 may include dielectric materials which are deposited over the semiconductor substrate 802, 902, respectively, after a pattern of gate structures is fabricated over the semiconductor substrates 802, 902. One example of a gate structure 910 is shown in FIG. 8.

Figure 1:
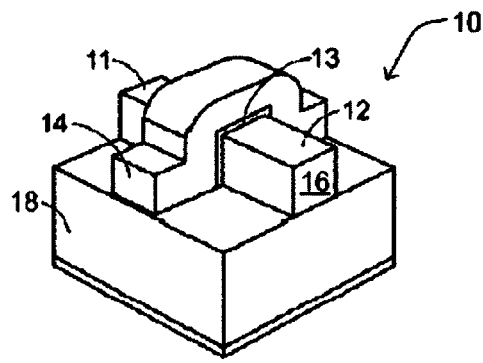
FIG. 1 is a schematic view of a prior art 3D FinFET structure.
Figure 8:
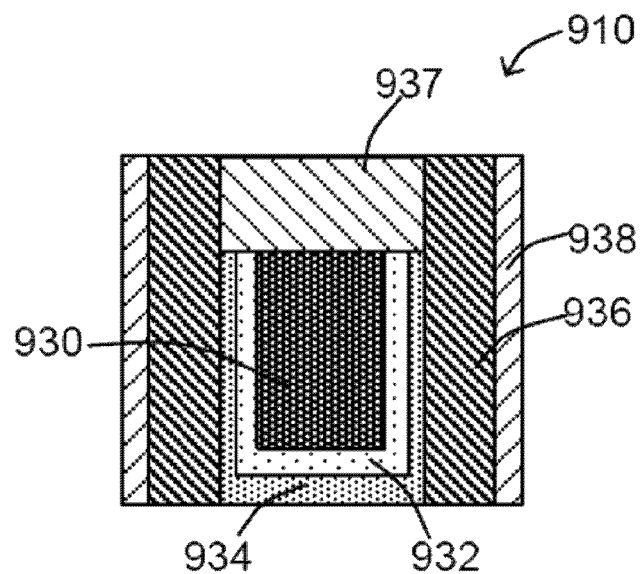
FIG. 8 illustrates a cross sectional view of an example of a gate structure 910, as also shown in FIG. 7A, cutting along the line A''-A''', according to one or more embodiments of the invention.

In FIG. 8, the structure of the gate structure 910 is shown, where the gate structure 910 is generally formed by depositing a layer of a dummy gate material, (e.g., polysilicon or amorphous silicon materials, among others). The dummy gate material is then patterned by photolithography and etching techniques during gate line patterning and gate slot patterning to form into three-dimension structures (e.g., structures and features of dummy gate lines and gate lines, which are spatially arranged in parallel and sectionalized by gate slot patterning techniques as discussed in sections related to FIGS. 5B-5D) atop of the fin structures. The dummy gate line structures are spatially arranged in a direction perpendicular to the direction of the fin structures (in a manner similar to the FinFET transistor structure 10 as shown in FIG. 1).

Then, a structure of a spacer 936 is formed on the sidewalls of the dummy gate structures and the spacer 936 may be made of silicon dioxide, silicon nitride or other suitable materials. Next, source and drain regions are formed and a layer of etch stop 938 can be deposited. Afterward, the interlayer dielectric (ILD) layer 806, 906 is deposited over the substrate (e.g., the semiconductor substrates 802, 902) and its surface is polished to expose the dummy gate structures such that the dummy gate material within a recess can be removed.

As shown in FIG. 8, a high-k material layer 934 is formed to cover the surface of the recess on the substrate where the dummy gate material is removed. Then, a work function metal layer 932 and a low-resistivity layer 930 (e.g., a tungsten or aluminum layer) are formed to fill the recess and the work function metal layer 932 and the low-resistivity layer 930 are polished to remove excessive work function metal layer 932 and low-resistivity layer 930. In addition, a sacrificial hardmask 937 is formed on the surface of the low-resistivity layer 930.

Detailed descriptions of a fabrication process of FinFET transistor structures in memory cells of a SRAM array are also disclosed in U.S. Pat. No. 8,361,854, (application Ser. No. 13/052,238), filed on Mar. 21, 2011, titled "FIN FIELD TRANSISTOR STRUCTURE AND MANUFACTURING PROCESS THEREOF", which is herein incorporated by reference in its entirety.

Referring back to FIGS. 6A and 7A, the pre-metal dielectric (PMD) layers 808, 908 which are made of dielectric materials, are formed over the semiconductor substrates 802, 902, respectively. The pre-metal dielectric (PMD) layer 808, 908 may be patterned to form contact holes, prior to filling the contact holes with one or more metallic layers and polishing the one or more metallic layers to remove excessive metallic layers and form a pattern of metal contacts (e.g., dummy metal contacts 224 and metal contacts 234, as shown in FIG. 6A, and dummy metal contacts 524 and metal contacts 534, as shown in FIG. 7A, etc.)

Comparing the cross-sectional views of FIGS. 6A and 7A, along the line A-A' of FIGS. 4A-4D and the line A"-A"' of FIGS. 5A-5D, respectively, it is designed that the extension of the first length, $L_1$, of the dummy gate slot 550A allows the cutting and additionally sectionalizing the first dummy gate line 522A and the second dummy gate line 522B, resulting in the loss of two gate structures 910 at locations in FIG. 7A, which are relative to the positions of the first dummy gate line 222A and the second dummy gate line 222B in FIG. 6A.

Figure 6B:
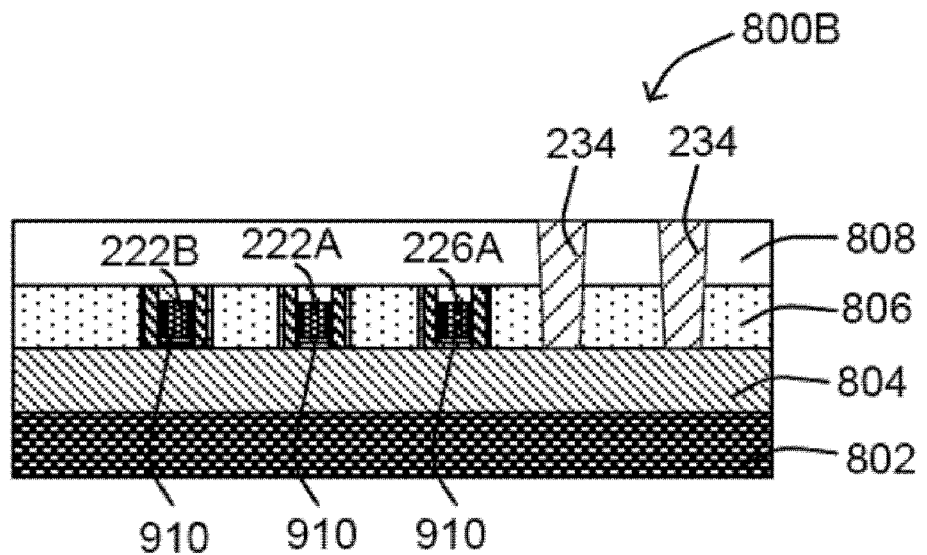
FIG. 6B illustrates a cross sectional view of the SRAM array 300 of FIG. 4A, cutting along a line B-B', showing the structures and the numbers of gates and metal contacts within the active cell, and the dummy gates and dummy metal contacts within the dummy edge cell.
Figure 7B:
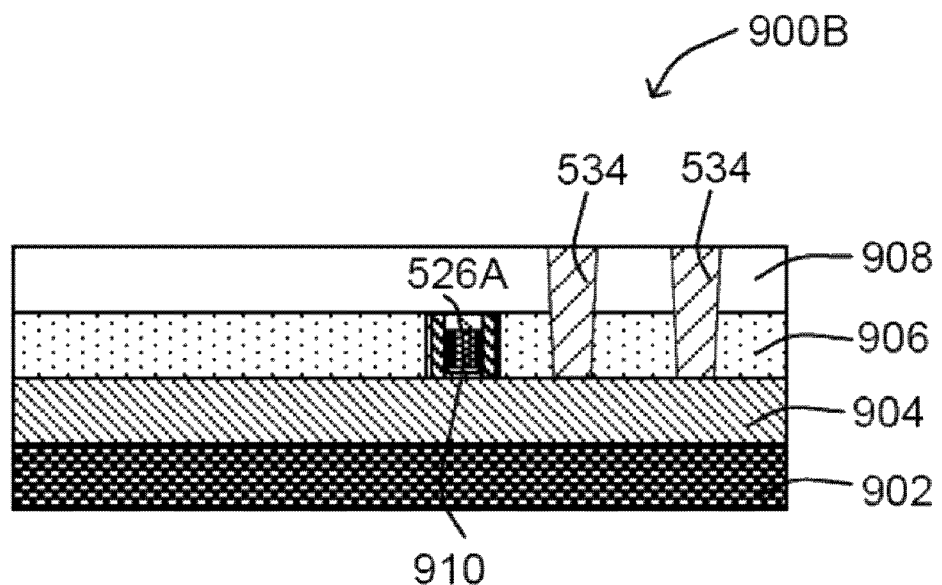
FIG. 7B illustrates a cross sectional view of the SRAM array 400 of FIG. 5A, cutting along a line B''-B''', showing the structures and the numbers of gates and metal contacts within the active cell, and the dummy gates and dummy metal contacts within the dummy edge cell, according to one or more embodiments of the invention.

In FIG. 6B, a portion of a SRAM array 800B is shown by cutting along the line B-B' of FIGS. 4A-4D to show the structures and the numbers of gates and metal contacts within the active cell, and the dummy gates and dummy metal contacts within the dummy edge cell. In FIG. 7B, a portion of a SRAM array 900B is shown by cutting along the line B"-B"' of FIGS. 5A-5D to show the structures and the numbers of gates and metal contacts within the active cell, and the dummy gates and dummy metal contacts within the dummy edge cell.

Comparing the cross-sectional views of FIGS. 6B and 7B, it is designed that the extension of the first length, $L_1$, of the dummy gate slot 550A allows the cutting and additionally sectionalizing the first dummy gate line 522A and the second dummy gate line 522B, resulting in the loss of two gate structures 910 at locations in FIG. 7B, which are relative to the positions of the first dummy gate line 222A and the second dummy gate line 222B in FIG. 6B.

Figure 6C:
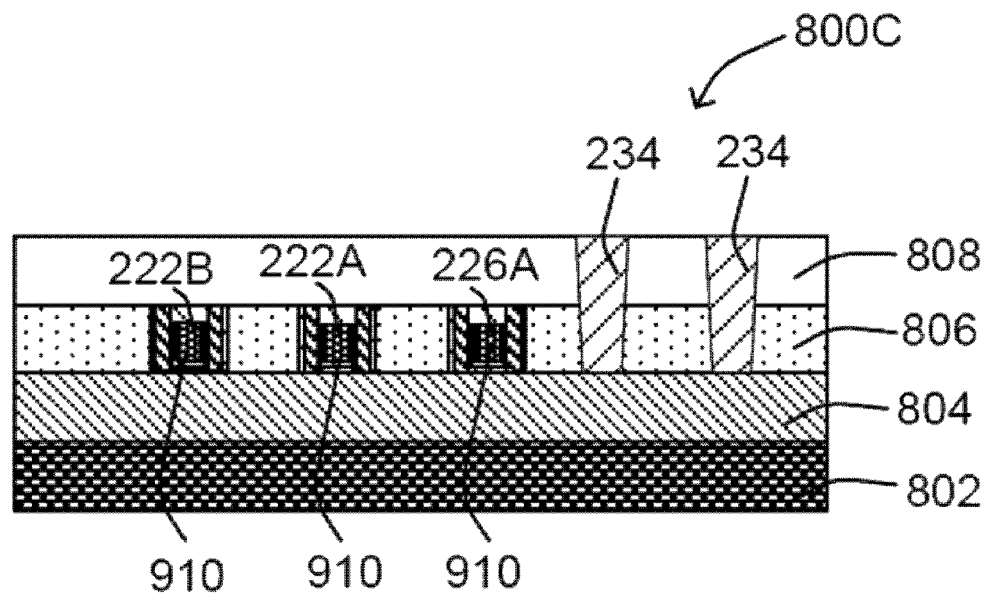
FIG. 6C illustrates a cross sectional view of the SRAM array 300 of FIG. 4A, cutting along a line C-C', showing the structures and the numbers of gates and metal contacts within the active cell, and the dummy gates and dummy metal contacts within the dummy edge cell.
Figure 7C:
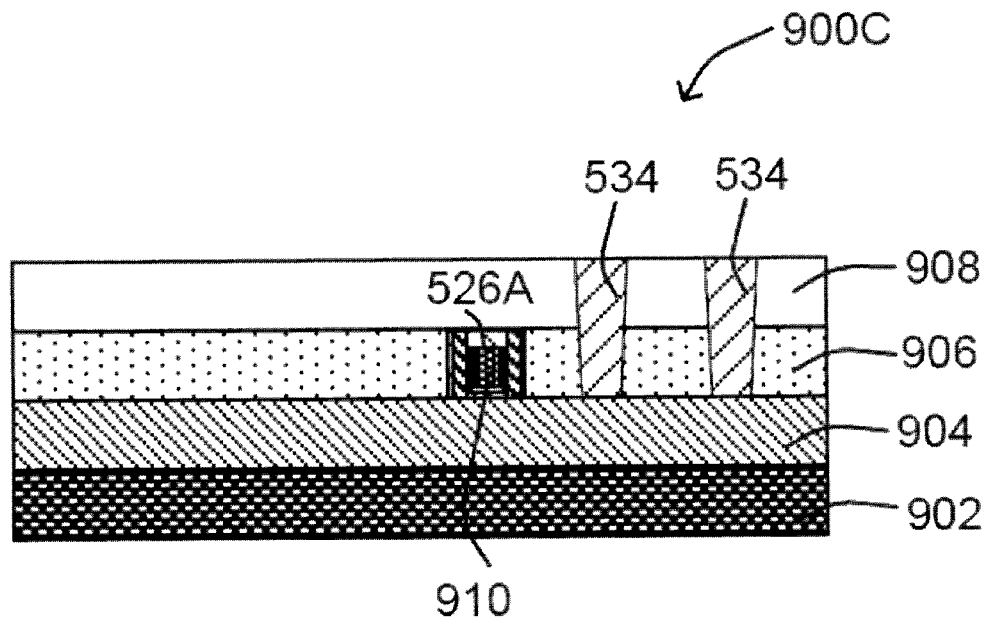
FIG. 7C illustrates a cross sectional view of the SRAM array 400 of FIG. 5A, cutting along a line C''-C''', showing the structures and the numbers of gates and metal contacts within the active cell, and the dummy gates and dummy metal contacts within the dummy edge cell, according to one or more embodiments of the invention.

In FIG. 6C a portion of a SRAM array 800C is shown by cutting along the line C-C' of FIGS. 4A-4D to show the structures and the numbers of gates and metal contacts within the active cell, and the dummy gates and dummy metal contacts within the dummy edge cell. In FIG. 7C a portion of a SRAM array 900C is shown by cutting along the line C"-C"' of FIGS. 5A-5D to show the structures and the numbers of the dummy gates and dummy metal contacts within the dummy edge cell.

Comparing the cross-sectional views of FIGS. 6C and 7C, it is designed that the extension of the first length, $L_1$, of the dummy gate slot 550A allows the cutting and additionally sectionalizing the first dummy gate line 522A and the second dummy gate line 522B, resulting in the loss of two gate structures 910 at locations in FIG. 7C, which are relative to the positions of the first dummy gate line 222A and the second dummy gate line 222B in FIG. 6C.

Figure 6D:
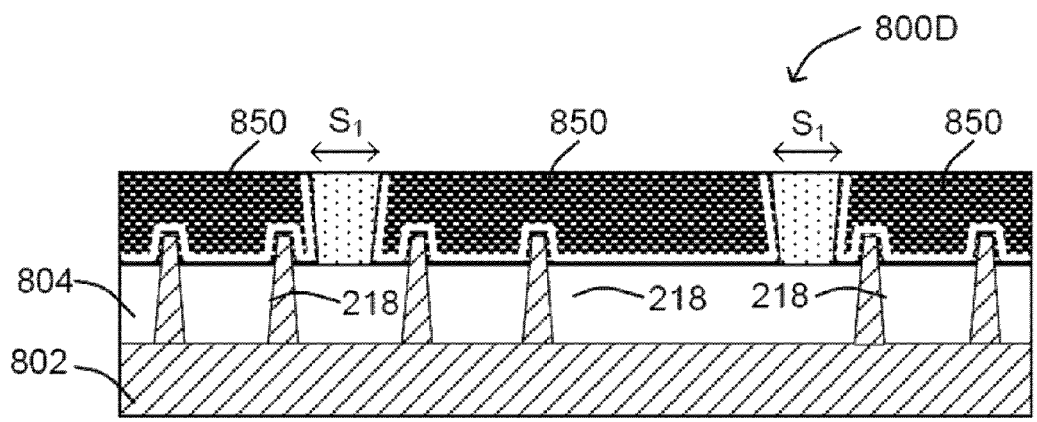
FIG. 6D illustrates a cross sectional view of the SRAM array 300 of FIG. 4A, cutting along a line D-D', showing the structures and the numbers of dummy gates and fins within the dummy edge cell.
Figure 7D:
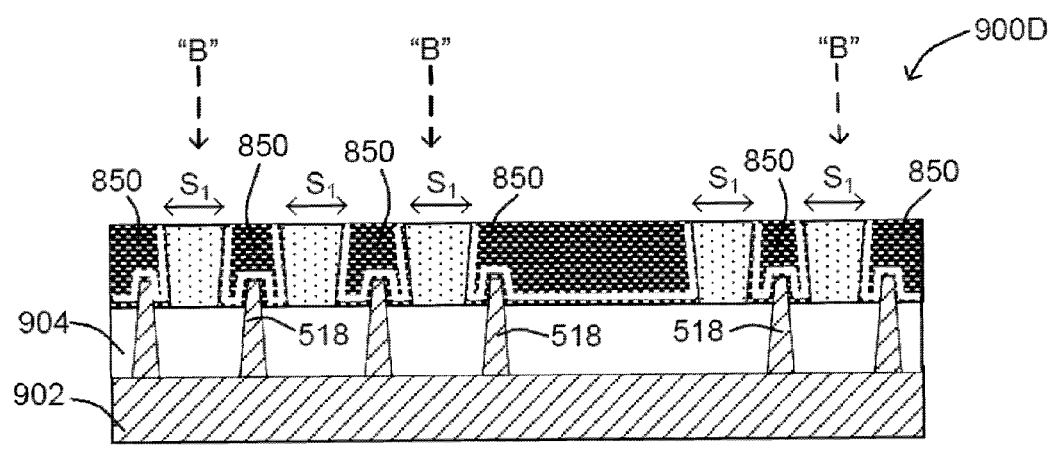
FIG. 7D illustrates a cross sectional view of the exemplary SRAM array of FIG. 5A, cutting along a line D''-D''', showing the structures and the numbers of dummy gates and fins within the dummy edge cell, according to one or more embodiments of the invention.

In FIG. 6D, a portion of a SRAM array 800D is shown by cutting along a line within the first dummy gate line 222A (e.g., the line D-D' of FIGS. 6A-6D) to show the structures and the numbers of dummy gates and fins within the dummy edge cell. In FIG. 7D a portion of a SRAM array 900D is shown by cutting along a line within the first dummy gate line 522A (e.g., the line D"-D'" of FIGS. 5A-5D) to show the structures and the numbers of the dummy gates and fins within the dummy edge cell.

Comparing the cross-sectional views of FIGS. 6D and 7D, it is designed that the extension of the first length, $L_1$, of the dummy gate slot 550A allows the cutting and additionally sectionalizing the first dummy gate line 522A, resulting in the formation of gate slots (with a width "$S_1$") at locations marked as "B" in FIG. 7D, which are relative to the positions of the dotted bubbles along the first dummy gate line 522A in FIG. 5A and correspond to the locations of gate slots 550A in FIG. 5B, where the opening width of the gate slots 550A is marked as "$S_1$".

Figure 9:
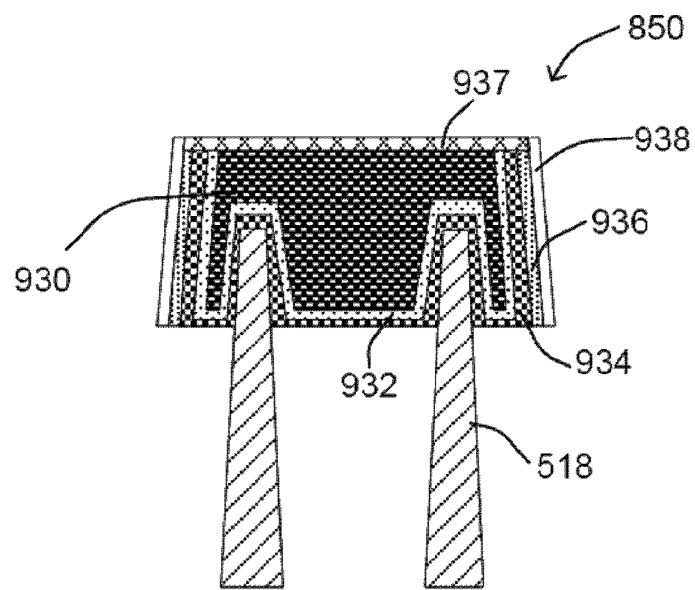
FIG. 9 illustrates a cross sectional view of an example of a gate structure 850, as also shown in FIG. 7D, cutting along the line D-D', according to one or more embodiments of the invention.

FIG. 9 illustrates a cross sectional view of the FinFET structure 850, as also shown in FIG. 7D, cutting along the line D"-D'" of FIGS. 5A-5D, according to one or more embodiments of the invention. The FinFET structure 850 includes one or more fin structures 518, the high-k material layer 934, the work function metal layer 932, the low-resistivity layer 930, the spacer 936, the etch stop 938, and the sacrificial hardmask 937, among others.

Referring back to FIG. 4A, the bit cell 110 of the SRAM array 300 may include the first gate line 226A and the second gate lines 226B, which are disposed at a first distance, "d1", apart. The dummy edge cell 120 may include the first dummy gate line 222A and the second dummy gate line 222B, which are disposed at a second distance, "d2", apart. The first dummy gate line 222A and the first gate line 226A are disposed at a third distance, "d3", apart near the boundary of the bit cells 110 and dummy edge cells 120.

In general, during the fabrication of the SRAM array 300 as shown in FIG. 4A, the distance between the gate lines and the dummy gate lines are kept at the same distance after gate line patterning, i.e., the first distance d1 equals to the second distance d2, which equals to the third distance d3. Within the SRAM array 300, the gate lines and dummy gate lines are spaced in equal distance (d1=d2=d3), which is not ideal as electric short will happen between two metal contacts 234 positioned near the boundary between the bit cells 110 and the dummy edge cells 120. One way to solve the problem is illustrated in FIG. 10.

Figure 10:
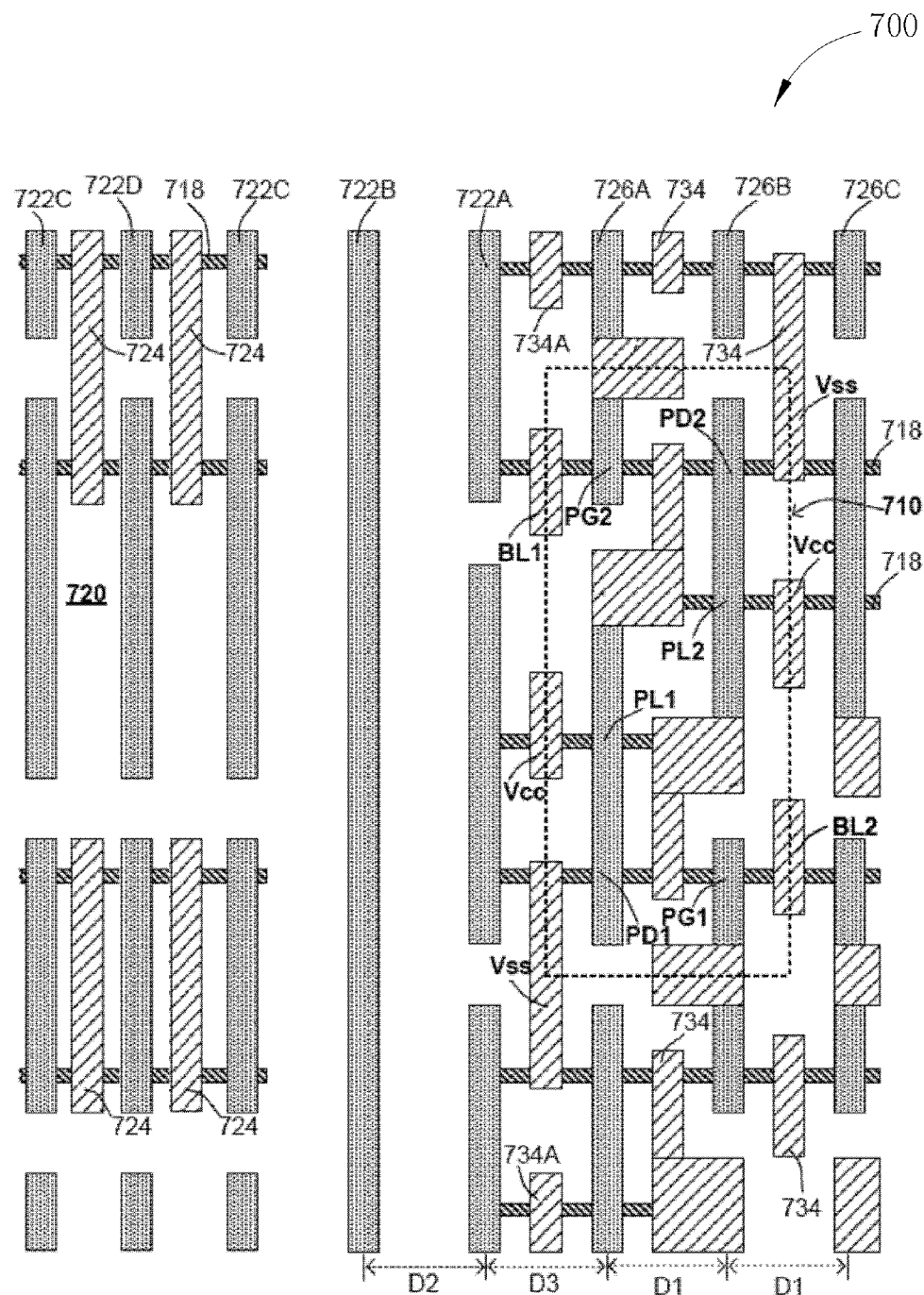
FIG. 10 illustrates a portion of an exemplary device design layout of a SRAM array 700 with a plurality of dummy gate lines being sectionalized within an exemplary dummy edge cell and a plurality of gate lines within an exemplary active cell, according to one or more embodiments of the invention.

FIG. 10 illustrates a portion of a device design layout of a SRAM array 700 near the boundary of a bit cell 710 and a dummy edge cell 720. According to one or more embodiments of the invention, the SRAM array 700 may include a plurality of dummy gate lines (e.g., the first dummy gate line 722A, the second dummy gate line 722B, and the third dummy gate line 722C, etc.) within the dummy edge cell 720. The SRAM array 700 may also include a plurality of gate lines (e.g., the first gate line 726A, the second gate line 726B, and the third gate line 726C, etc.) within the bit cell 710. The SRAM array 700 further includes a plurality of fin structures 718, a plurality of metal contacts 734, and a plurality of metal contacts 734A.

In one embodiment, the distance between the gate lines and the dummy gate lines within the SRAM array 700 are kept at different distances among them after gate line patterning in order to solve the problem of electric short happens between two metal contacts 734A. For example, the first gate line 726A and the second gate lines 726B are disposed at a first distance, "$D_1$", apart. In addition, the second gate line 726B and the third gate lines 726C are disposed at a first distance, "$D_1$", apart.

Further, the first dummy gate line 722A and the second dummy gate line 722B are disposed at a second distance, "$D_2$", apart. The first dummy gate line 722A and the first gate line 726A are disposed at a third distance, "$D_3$", apart near the bit line at the boundary of the bit cells 710 and the dummy word line edge cells 720.

In one embodiment, the third distance ($D_3$) is different from the first distance ($D_1$). In another embodiment, the third distance ($D_3$) is larger than the first distance ($D_1$). In still another embodiment, the third distance ($D_3$) is larger than the second distance ($D_2$). In practice, a hardmask is used to process a semiconductor device during gate line patterning with a gate line pattern such that the third distance ($D_3$) is different from the first distance ($D_1$) in order to prevent electric short from happening between two metal contacts 734A.

Figure 11:
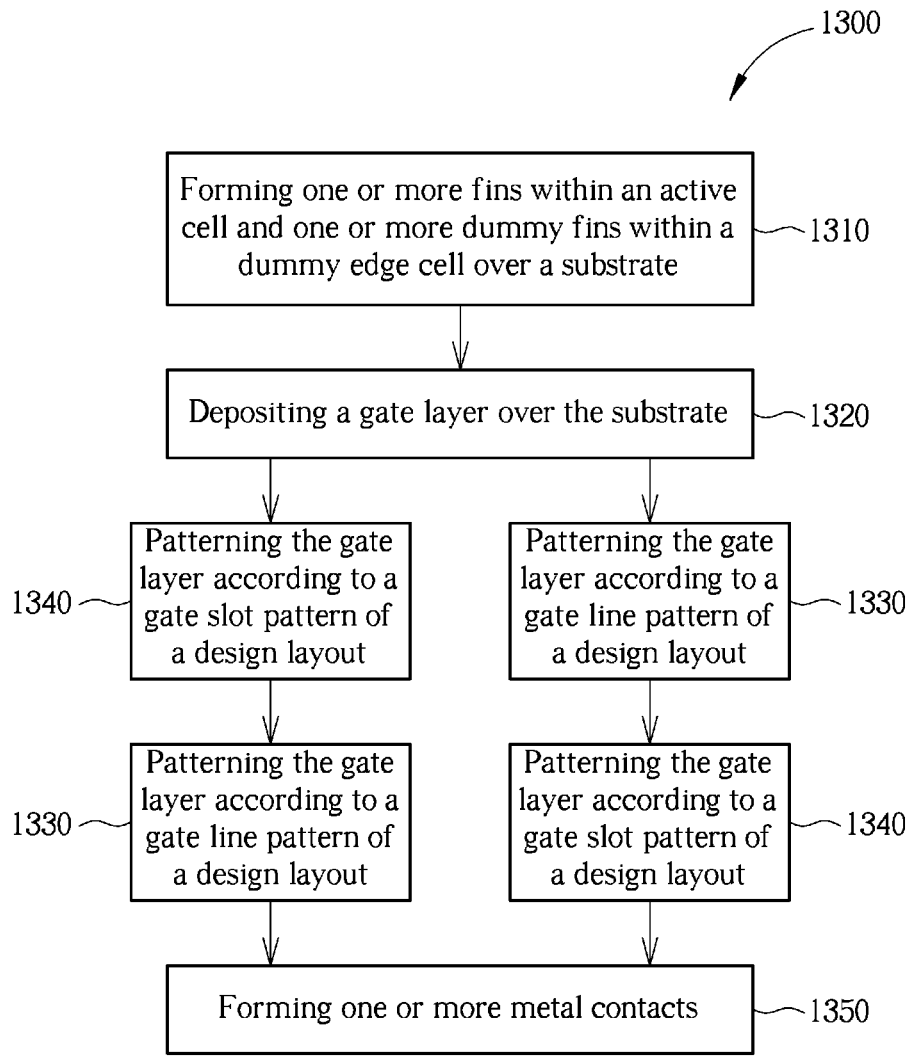
FIG. 11 is a flow chart of a method 1300 of fabricating a semiconductor device, according to one or more embodiments of the invention.

FIG. 11 is a flow chart of a method 1300 of fabricating a semiconductor device, according to one or more embodiments of the invention. The method 1300 includes a step 1310 of forming one or more fins within an active cell and one or more dummy fins within a dummy edge cell over a substrate. In one aspect, the dummy edge cell is disposed adjacent the active cell over the substrate. At step 1320, a gate layer is deposited over the substrate.

At step 1330, the gate layer is patterned by performing lithography and etching according to a gate line pattern of a design layout to define and form gate lines (e.g., a first gate line and a second gate line, etc.) within the active cell, and dummy gate lines (e.g., a first dummy gate line and a second dummy gate line, etc.) within the dummy edge cell. At step 1340, the gate layer can also be patterned by performing lithography and etching according to a gate slot pattern of the design layout to define gate slots in the gate layer, where the gate lines are sectionalized as a result. In one embodiment, the step 1330 and the step 1440 can be performed sequentially. In another embodiment, the step 1330 and the step 1340 can be performed in reversed order, as shown in FIG. 11.

At step 1350, one or more metal contacts are formed. In one embodiment, the gate layer is patterned according to the gate slot pattern of the design layout so as to sectionalize the first dummy gate line at at least one location between two metal contacts during the patterning of the gate layer. In one embodiment, the first dummy gate line is sectionalized such that the dummy gates on the first dummy gate line are spaced a gate-end spacing, $S_1$, apart.

In another embodiment, the first dummy gate line is sectionalized at at least one location positioned between two metal contacts by a plurality of gate slots during gate slot patterning. In still another embodiment, a hardmask is used to process a semiconductor device during the patterning of the gate layer by performing lithography and etching according to a gate slot pattern. In one aspect, the gate slot pattern may include one or more first gate slots (e.g., dummy gate slots 550A) within the dummy edge cell and one or more second gate slots (e.g., gate slots 550B) within the active cell.

In one aspect, a gate slot pattern is used during the gate slot patterning and the gate slot pattern includes one or more first gate slots at a first length within the dummy edge cell and one or more second gate slots at a second length within the active cell. In another aspect, the first length is more than one and a half times in length than the second length. In one example, a first length, $L_1$, of the first gate slots is longer than a length, $L_B$, of the second gate slots.

In still another aspect, patterning the gate layer according to the gate slot pattern is performed prior to the patterning the gate layer according to the gate line pattern. In yet another aspect, patterning the gate layer and performing lithography according to the gate slot pattern is performed after the patterning the gate layer and performing lithography according to the gate line pattern.

Figure 12:
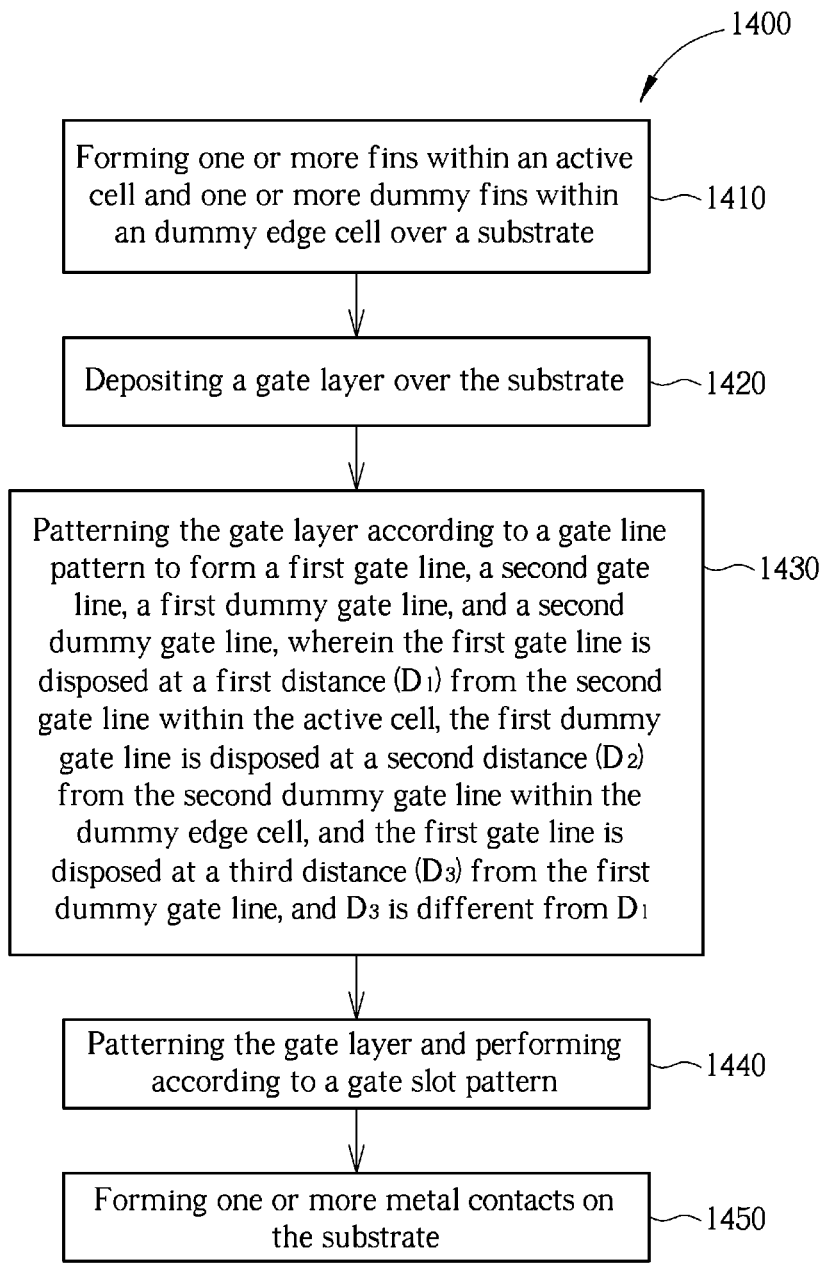
FIG. 12 is a flow chart of a method 1400 of fabricating a semiconductor device, according to one or more embodiments of the invention.

FIG. 12 is a flow chart of a method 1400 of fabricating a semiconductor device, according to one or more embodiments of the invention. The method 1400 includes a step 1410 of forming one or more fins within an active cell and one or more dummy fins within a dummy edge cell. In one aspect, the dummy edge cell is disposed adjacent the active cell over a substrate. At step 1420, agate layer is deposited over the substrate.

At step 1430, the gate layer is patterned by performing lithography and etching according to a gate line pattern to form a plurality of gate lines (e.g., a first gate line and a second gate line, etc.) within the active cell, and a plurality of dummy gate lines (e.g., a first dummy gate line and a second dummy gate line, etc.) within the dummy edge cell. In one embodiment, the first gate line is disposed at disposed at a first distance ($D_1$) from the second gate line within the active cell. In another embodiment, the first dummy gate line is adjacent the one or more bit line metal contacts and disposed at a second distance ($D_2$) from the second dummy gate line.

At step 1440, the gate layer is patterned by performing lithography and etching according to a gate slot pattern to define slots in the gate layer. In one embodiment, the step 1330 and the step 1440 can be performed sequentially or vice versa.

At step 1450, one or more metal contacts are formed where at least some of the one or more metal contacts is adjacent the first dummy gate line and adjacent the first gate line. In one embodiment, a third distance ($D_3$) is positioned between the first gate line and the first dummy gate line. On aspect of the invention provides that the third distance ($D_3$) is different from the first distance ($D_1$). In another aspect, the third distance ($D_3$) is larger the first distance ($D_1$). In another aspect, the third distance ($D_3$) is larger the second distance ($D_2$).

In one embodiment, a hardmask is used to process the semiconductor device during the patterning of the gate layer according to the gate line pattern. In one aspect, the gate layer is patterned by performing lithography and etching according to the gate slot pattern, prior to patterning the gate layer by performing lithography and etching according to the gate line pattern. In another aspect, the gate layer is patterned by performing lithography and etching according to the gate slot pattern, after patterning the gate layer by performing lithography and etching according to the gate line pattern.

While the foregoing is directed to embodiments of the present invention, other and further embodiments of the invention may be devised without departing from the basic scope thereof, and the scope thereof is determined by the claims that follow.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
   depositing a gate layer over a substrate;
   patterning the gate layer according to a gate slot pattern and a gate line pattern to form a first gate line and a second gate line within an active cell, and a first dummy gate line and a second dummy gate line within a dummy edge cell; and
   forming a first metal contact and a second metal contact in the active cell, wherein the first gate line is adjacent the first metal contact and the second metal contact and disposed at a first distance (D1) from the second gate line within the active cell,
   wherein the first dummy gate line is sectionalized at at least one location positioned between the first metal contact and the second metal contact through the gate slot pattern, wherein the at least one location is only disposed within the dummy edge cell;
   wherein the first dummy gate line is adjacent the first metal contact and the second metal contact and disposed at a second distance (D2) from a second dummy gate line,
   wherein the first gate line is disposed at a third distance (D3) from the first dummy gate line, and
   wherein the third distance (D3) is different from the first distance (D1).

2. The method of claim 1, wherein the third distance (D3) is larger than the first distance (D1).

3. The method of claim 1, wherein the third distance (D3) is larger than the second distance (D2).

4. The method of claim 1, wherein the patterning the gate layer according to the gate slot pattern is performed prior to the patterning the gate layer according to the gate line pattern.

5. The method of claim 1, wherein the patterning the gate layer according to the gate slot pattern is performed after the patterning the gate layer according to the gate line pattern.

* * * * *